(12) United States Patent
Watanabe et al.

(10) Patent No.: US 11,142,821 B2
(45) Date of Patent: Oct. 12, 2021

(54) METHOD FOR PRODUCING SINGLE CRYSTAL SUBSTRATE HAVING A PLURALITY OF GROOVES USING A PAIR OF MASKS

(71) Applicant: Seiko Epson Corporation, Tokyo (JP)

(72) Inventors: Yukimune Watanabe, Hokuto (JP); Noriyasu Kawana, Matsumoto (JP)

(73) Assignee: Seiko Epson Corporation

( * ) Notice: Subject to any disclaimer, the term of this patent is extended or adjusted under 35 U.S.C. 154(b) by 20 days.

(21) Appl. No.: 16/628,785

(22) PCT Filed: Jun. 28, 2018

(86) PCT No.: PCT/JP2018/024615
§ 371 (c)(1),
(2) Date: Jan. 6, 2020

(87) PCT Pub. No.: WO2019/009182
PCT Pub. Date: Jan. 10, 2019

(65) Prior Publication Data
US 2020/0140998 A1    May 7, 2020

(30) Foreign Application Priority Data

Jul. 7, 2017   (JP) .............................. JP2017-133415

(51) Int. Cl.
*C30B 33/08*       (2006.01)
*C23C 16/32*       (2006.01)
(Continued)

(52) U.S. Cl.
CPC ............ *C23C 16/325* (2013.01); *C30B 25/18* (2013.01); *C30B 29/04* (2013.01); *C30B 29/36* (2013.01);
(Continued)

(58) Field of Classification Search
CPC ....... C30B 23/00; C30B 23/025; C30B 23/04; C30B 23/06; C30B 23/063; C30B 25/00;
(Continued)

(56) References Cited

U.S. PATENT DOCUMENTS

2002/0035960 A1     3/2002  Nakano et al.
2002/0124793 A1*    9/2002  Nakano ................... C30B 29/36
                                                              117/84
2006/0169987 A1*    8/2006  Miura ................. H01L 21/0245
                                                              257/79

FOREIGN PATENT DOCUMENTS

JP      2004-189598 A     7/2004
JP      2006-196631 A     7/2006

OTHER PUBLICATIONS

Kentaro Shibahara et al., "Surface Morphology of Cubic SiC(100) Grown on Si(100) by Chemical Vapor Deposition", Journal of Crystal Growth 78, Elsevier Science Publishers B.V., North-Holland, Amsterdam, 1986, pp. 538-544.

* cited by examiner

*Primary Examiner* — Kenneth A Bratland, Jr.
(74) *Attorney, Agent, or Firm* — Harness, Dickey & Pierce, P.L.C.

(57) ABSTRACT

A single crystal substrate is provided and is characterized in that the single crystal substrate has a foundation substrate provided with a plurality of grooves, which include a first crystal face and a second crystal face opposed to the first crystal face in an inner face thereof, and the extending direction of which is a <110> direction, and an angle formed by the first crystal face and the second crystal face is more than 70.6°. Further, it is preferred that the angle formed by the first crystal face and the second crystal face is 100° or more and 176° or less.

1 Claim, 4 Drawing Sheets

(51) Int. Cl.
   *C30B 25/18* (2006.01)
   *C30B 29/04* (2006.01)
   *C30B 29/36* (2006.01)
   *H01L 21/02* (2006.01)
(52) U.S. Cl.
   CPC .......... *C30B 33/08* (2013.01); *H01L 21/0262* (2013.01)
(58) Field of Classification Search
   CPC ......... C30B 25/02; C30B 25/04; C30B 25/10; C30B 25/18; C30B 25/186; C30B 29/00; C30B 29/02; C30B 29/04; C30B 29/10; C30B 29/36; C30B 33/00; C30B 33/02; C30B 33/08; C30B 33/12; C23C 16/30; C23C 16/32; C23C 16/325; H01L 21/0262
   USPC ... 117/84, 88–90, 94–95, 97, 101, 106, 937, 117/951
   See application file for complete search history.

FIG. 9

METHOD FOR PRODUCING SINGLE CRYSTAL SUBSTRATE HAVING A PLURALITY OF GROOVES USING A PAIR OF MASKS

This application is a U.S. National Phase application of International Application No. PCT/JP2018/024615, filed on Jun. 28, 2018 and published in Japanese as WO 2019-009182 A1 on Jan. 10, 2019, which is based on, and claims priority from JP Application Serial Number 2017-133415, filed on Jul. 7, 2017. The disclosures of the above applications are incorporated by reference herein in their entirety.

BACKGROUND

1. Technical Field

The present invention relates to a single crystal substrate, a method for producing a single crystal substrate, and a silicon carbide substrate.

2. Related Art

Silicon carbide (SiC) is a wide band gap semiconductor having a band gap (2.36 to 3.23 eV) that is two or more times wider than that of Si, and has attracted attention as a material for a high withstand voltage device.

However, since the crystallization temperature of SiC is high unlike Si, it is difficult to form a single crystal ingot by a pulling-up method from a liquid phase in the same manner as a Si substrate. Therefore, a method in which a single crystal ingot of SiC is formed by a sublimation method has been proposed. However, it is very difficult to form a substrate having a large diameter and few crystal defects by such a sublimation method. On the other hand, among SiC crystals, cubic SiC (3C—SiC) can be formed at a relatively low temperature, and therefore, a method in which cubic SiC is epitaxially grown on a substrate has been proposed.

As one method for producing a SiC substrate using this epitaxial growth, a heteroepitaxial technique in which 3C—SiC is grown on a Si substrate in a gas phase has been studied. For example, Journal of Crystal Growth 78 (1986) 538-544 discloses that by using an offset substrate in which in a Si(100) substrate, a [001] direction is inclined to a [100] direction by about 4°, SiC is epitaxially grown on a surface thereof. By doing this, in a SiC growth layer, a reduction of crystal defects called anti-phase boundary (APB) can be achieved.

Further, JP-A-2006-196631 discloses a semiconductor device having a semiconductor substrate provided with a groove including a bottom portion of a (001) plane, and a facet composed of a (111) plane, a (-1-11) plane, and a (-111) plane, a semiconductor buffer layer provided on the semiconductor substrate, and a first semiconductor layer provided on the semiconductor buffer layer.

However, in the offset substrate or the semiconductor substrate including the groove in the related art, reduction in crystal defects cannot be sufficiently achieved.

An object of the invention is to provide a single crystal substrate capable of forming a silicon carbide growth layer with few crystal defects, a method for producing a single crystal substrate capable of efficiently producing such a single crystal substrate, and a silicon carbide substrate having a silicon carbide growth layer of high quality.

SUMMARY

The above object is achieved by the following.

A single crystal substrate is characterized in that the single crystal substrate has a foundation substrate provided with a plurality of grooves, which include a first crystal face and a second crystal face opposed to the first crystal face in an inner face thereof, and the extending direction of which is a <110> direction, and an angle formed by the first crystal face and the second crystal face is more than 70.6°.

According to this, when silicon carbide is epitaxially grown by using the single crystal substrate including the grooves as a foundation, crystal defects in a silicon carbide crystal can be efficiently vanished or reduced. Therefore, a single crystal substrate capable of forming a silicon carbide growth layer with few crystal defects is obtained.

In the single crystal substrate, it is preferred that the angle formed by the first crystal face and the second crystal face is 100° or more and 176° or less.

According to this, crystal defects can be more efficiently vanished or reduced.

In the single crystal substrate, it is preferred that the foundation substrate further includes a Si{100} plane as a planar face provided between the grooves.

According to this, the planar face and the grooves can be highly accurately formed, and therefore, a silicon carbide growth layer can be efficiently and stably grown toward the groove from a silicon carbide foundation film. As a result, even when the silicon carbide growth layer to be grown is thin, crystal defects can be more efficiently vanished or reduced.

In the single crystal substrate, it is preferred that the foundation substrate further includes a plane formed by inclining a Si{100} plane to the <110> direction by an angle more than 0° and less than 54.7° as a planar face provided between the grooves.

According to this, crystal defects can be vanished or reduced not only in the groove, but also in the planar face. As a result, a silicon carbide growth layer with fewer crystal defects and of high quality can be formed.

In the single crystal substrate, it is preferred that an angle formed by the planar face and the first crystal face is a larger angle than an angle formed by the planar face and a Si{111} plane.

According to this, crystal defects are associated with each other with a higher probability, and can be vanished or reduced.

It is preferred that the single crystal substrate further includes a silicon carbide foundation film provided on the planar face.

According to this, when a silicon carbide growth layer is grown on the single crystal substrate, a crystal can be grown toward the groove by using the silicon carbide foundation film as a seed layer. As a result, a silicon carbide growth layer of higher quality is obtained.

In the single crystal substrate, it is preferred that the foundation substrate contains silicon, polycrystalline silicon carbide, or diamond.

According to this, a silicon carbide growth layer of higher quality can be formed.

A method for producing a single crystal substrate is a method for producing the single crystal substrate, and is characterized by including:

a step of preparing a single crystal base material and a base material with a mask including a first mask provided in a portion of a surface thereof;

a step of providing a second mask on the surface of the single crystal base material;

a step of subjecting the single crystal base material to an etching treatment, thereby forming the groove in a region facing the first mask in the surface of the single crystal base material; and a step of removing the first mask.

According to this, a single crystal substrate can be efficiently produced.

A silicon carbide substrate is characterized by including:
the single crystal substrate; and
a silicon carbide growth layer formed on the single crystal substrate.

According to this, a silicon carbide substrate including a semiconductor layer capable of forming a power device by utilizing a wide band gap of the silicon carbide growth layer and few crystal defects therein is obtained.

DETAILED DESCRIPTION

Hereinafter, a single crystal substrate, a method for producing a single crystal substrate, and a silicon carbide substrate will be described in detail based on preferred embodiments shown in the accompanying drawings.

Silicon Carbide Substrate

First, an embodiment of a silicon carbide substrate will be described.

Figure 1:
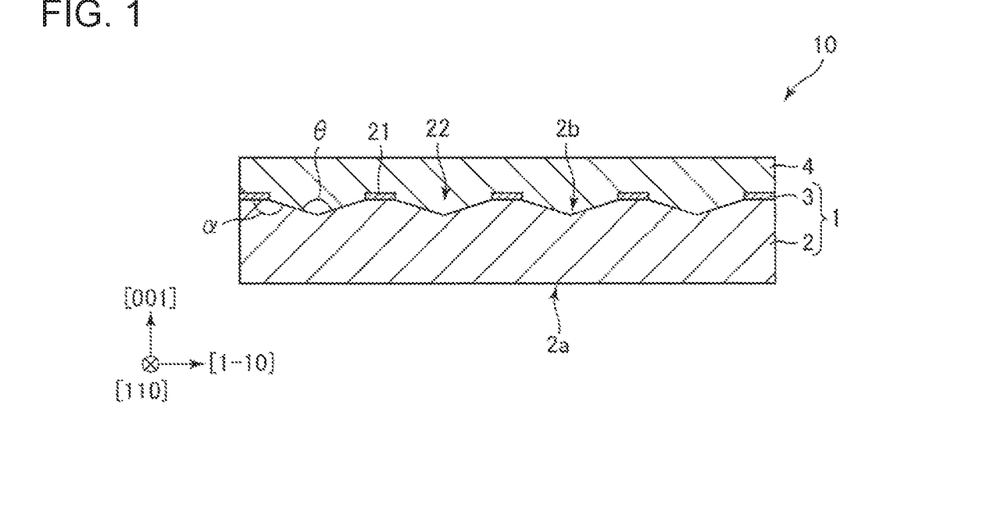
FIG. 1 is a longitudinal cross-sectional view of a silicon carbide substrate according to this embodiment.

FIG. 1 is a longitudinal cross-sectional view of a silicon carbide substrate 10 according to this embodiment.

A silicon carbide substrate 10 (an embodiment of a silicon carbide substrate of the invention) includes a single crystal substrate 1 (an embodiment of a single crystal substrate of the invention) and a silicon carbide growth layer 4 formed on the single crystal substrate 1. This silicon carbide growth layer 4 is used as a semiconductor layer capable of forming, for example, the below-mentioned power device by utilizing a wide band gap thereof and few crystal defects therein.

As such a silicon carbide growth layer 4, for example, a semiconductor layer constituted by a cubic silicon carbide (3C—SiC) is exemplified. The cubic silicon carbide has a wide band gap of 2.36 eV or more, and also has a high thermal conductivity and a high breakdown electric field, and therefore is particularly preferably used as a wide band gap semiconductor for a power device. Incidentally, the silicon carbide growth layer 4 is not limited to the semiconductor layer constituted by 3C—SiC, and may be a semiconductor layer constituted by 4H—SiC or 6H—SiC.

Then, by using the below-mentioned single crystal substrate 1, the silicon carbide growth layer 4 with few crystal defects and of high quality can be formed.

Incidentally, examples of the power device produced using the silicon carbide substrate 10 include a transistor for a boost converter and a diode. Specific examples thereof include a MOSFET (metal-oxide-semiconductor field-effect transistor), an insulated-gate bipolar transistor (IGBT), and a Schottky barrier diode (SBD).

Hereinafter, the single crystal substrate 1 will be described in more detail.

Single Crystal Substrate

Figure 2:
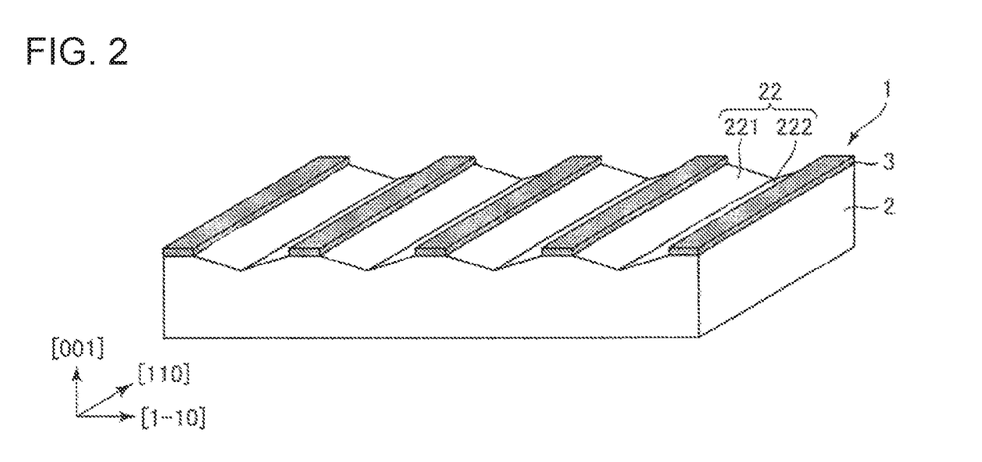
FIG. 2 is a perspective view showing a single crystal substrate included in the silicon carbide substrate shown in FIG. 1.
Figure 3:
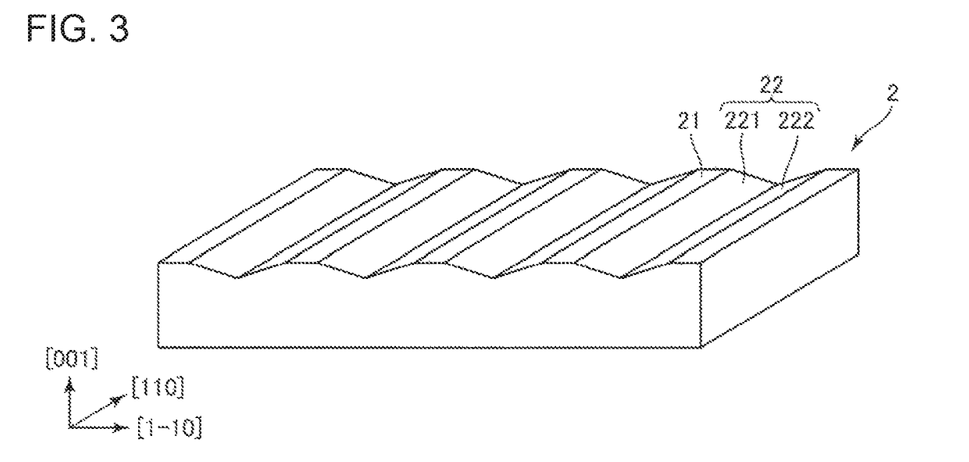
FIG. 3 is a perspective view showing only a foundation substrate included in the single crystal substrate shown in FIG. 2.

FIG. 2 is a perspective view showing the single crystal substrate 1 included in the silicon carbide substrate 10 shown in FIG. 1. Further, FIG. 3 is a perspective view showing only a foundation substrate 2 included in the single crystal substrate 1 shown in FIG. 2.

The single crystal substrate 1 includes the foundation substrate 2 and a silicon carbide foundation film 3 provided on the foundation substrate 2. Such a single crystal substrate 1 is used, for example, as a foundation for epitaxially growing the silicon carbide growth layer 4 by using the silicon carbide foundation film 3 as a seed layer.

Foundation Substrate

The foundation substrate 2 is not particularly limited as long as it is a substrate of a single crystal, but is, for example, a silicon substrate, a polycrystalline silicon carbide substrate, a diamond substrate, a sapphire substrate, a quartz substrate, or a composite substrate in which such a crystal is deposited on an arbitrary substrate.

Among these, the foundation substrate 2 preferably contains silicon, polycrystalline silicon carbide, or diamond, and is more preferably constituted by a crystalline material containing any of these as a main material. Any of these foundation substrates 2 contains a cubic crystal and is favorable as a foundation for growing silicon carbide. Therefore, by using such a foundation substrate 2, the silicon carbide growth layer 4 of higher quality can be formed.

The thickness of the foundation substrate 2 is appropriately set so as to have a mechanical strength to such an extent that it can withstand handling in a step of forming the silicon carbide growth layer 4, but is preferably about 100 μm or more and 2 mm or less as an example.

As the foundation substrate 2 shown in FIG. 1, a single crystal silicon substrate having a Si(001) plane as a principal plane is exemplified as an example. Then, a lower face 2a of the foundation substrate 2 becomes a planar face of the Si(001) plane. On the other hand, an upper face 2b of the foundation substrate 2 includes a plurality of planar faces 21 each composed of a Si(001) plane and a plurality of grooves 22, the extending direction of which is a [110] direction. That is, in the upper face 2b, the plurality of planar faces 21 extending in the [110] direction and the plurality of grooves 22 extending in the [110] direction are alternately aligned in a direction orthogonal to the [110] direction. According to this, the upper face 2b becomes a face with a concave-convex shape in which a convex portion (mountain) having the planar face 21 as a top face and a concave portion (valley) composed of the groove 22 are alternately aligned in a [1-10] direction.

Incidentally, the plurality of grooves 22 are preferably parallel to one another, however, some deviation due to production errors is permitted. Further, a non-parallel portion may be partially included therein or it may be curved or bent in the middle.

Here, the transverse cross-sectional shape of each groove 22 is a V shape. That is, each groove 22 includes a first crystal face 221 and a second crystal face 222 opposed to the first crystal face 221 in an inner face thereof. Then, each groove 22 extends in the [110] direction while maintaining the transverse cross-sectional shape of the V shape constituted by such a first crystal face 221 and a second crystal face 222. Incidentally, the state where the first crystal face 221 and the second crystal face 222 are opposed to each other refers to a state where both are located in an inner face of the groove 22, and also are located opposite to each other across the bottom of the groove 22.

Incidentally, an opening angle θ of the groove 22, that is, an angle formed by the first crystal face 221 and the second crystal face 222 is more than 70.6°. The groove 22 having such an opening angle θ can efficiently vanish or reduce crystal defects in a silicon carbide crystal when silicon carbide is epitaxially grown by using the single crystal substrate 1 including the groove 22 in the upper face 2b as the foundation. According to this, the silicon carbide growth layer 4 of high quality is obtained.

Figure 4:
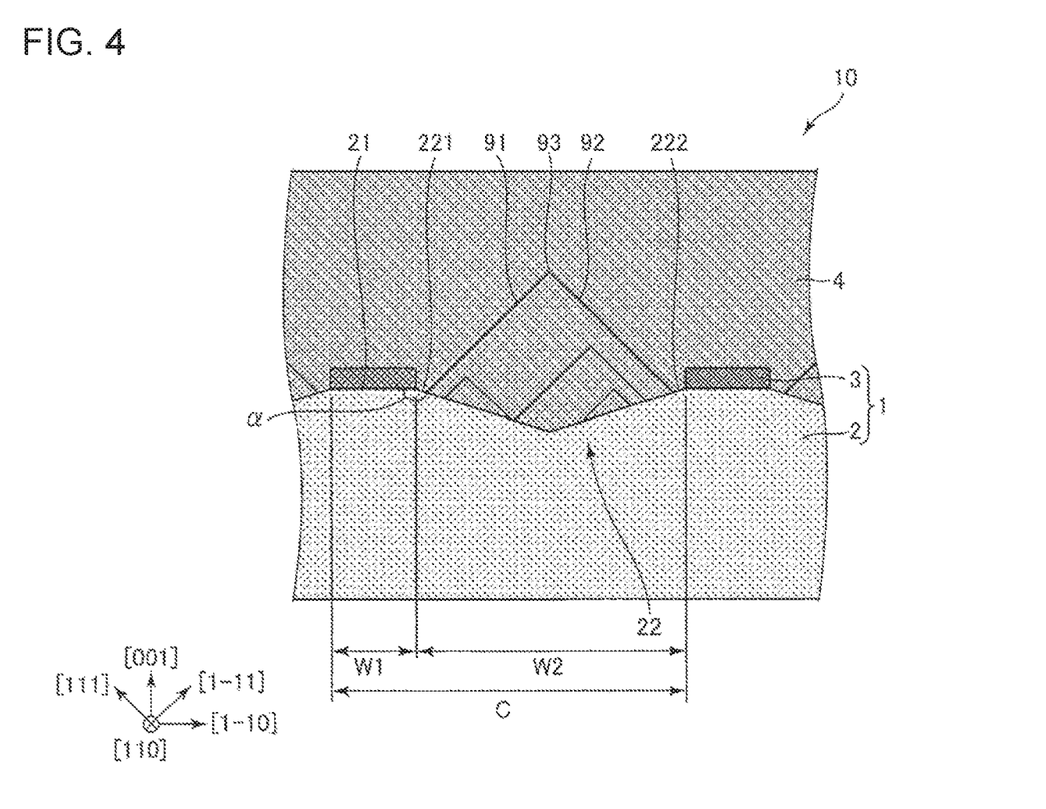
FIG. 4 is an enlarged view of the silicon carbide substrate shown in FIG. 1 and is a view schematically showing one example of a crystal defect.

Here, FIG. 4 is an enlarged view of the silicon carbide substrate 10 shown in FIG. 1 and is a view schematically showing one example of a crystal defect.

As described above, in the groove 22, the first crystal face 221 and the second crystal face 222 face each other. In the example shown in FIG. 4, a crystal defect 91 originating from the first crystal face 221 progresses in parallel to a Si(111) plane. On the other hand, a crystal defect 92 originating from the second crystal face 222 progresses in parallel to a Si(1-11) plane. Then, the crystal defect 91 and the crystal defect 92 are associated with each other at an association point 93 and vanished. In such a manner, in the silicon carbide growth layer 4 grown on the single crystal substrate 1 having the groove 22, the crystal defects 91 and 92 progressing in mutually different directions are associated with each other and can be vanished or reduced.

Incidentally, when the opening angle θ of the groove 22 is less than the above lower limit, the opening angle θ is too narrow, and therefore, the probability that the crystal defects 91 and 92 are associated with each other is decreased, and the crystal defects 91 and 92 cannot be sufficiently reduced.

Further, the opening angle θ of the groove 22 is preferably 100° or more and 176° or less, more preferably 150° or more and 175° or less, further more preferably 166° or more and 174° or less. According to this, the crystal defects 91 and 92 can be more efficiently vanished or reduced. Incidentally, when the opening angle θ of the groove 22 exceeds the above upper limit, the effect of providing the groove 22 is diminished, and therefore, the probability that the crystal defects 91 and 92 are associated with each other is decreased, and it may not be able to sufficiently reduce the crystal defects 91 and 92.

The opening angle θ of the groove 22 can be adjusted according to the width of the groove 22, the forming time of the groove 22, or the like. For example, by increasing the width of the groove 22, the opening angle θ of the groove 22 can be made larger, and on the other hand, by decreasing the width of the groove 22, the opening angle θ of the groove 22 can be made smaller. Further, by increasing the forming time of the groove 22, the groove 22 can be made deeper, and therefore, the opening angle θ of the groove 22 can be made smaller, and on the other hand, by decreasing the forming time of the groove 22, the groove 22 can be made shallower, and therefore, the opening angle θ of the groove 22 can be made larger.

Such a groove 22 extends in the [110] direction as described above. Further, the foundation substrate 2 has the plurality of grooves 22, and these are aligned in a direction orthogonal to the [110] direction.

On the other hand, the foundation substrate 2 according to this embodiment has the Si(001) plane as the planar face 21 provided between the adjacent grooves 22 as described above. By providing such a planar face 21, the upper face 2b of the foundation substrate 2 becomes a face facilitating processing of the groove 22, and therefore becomes a face having a concave-convex shape in which the planar face 21 and the groove 22 are alternately and highly accurately aligned. Such an upper face 2b can more efficiently vanish or reduce crystal defects even when the film thickness of the silicon carbide growth layer 4 to be grown on the single crystal substrate 1 is thin.

Here, the planar face 21 according to this embodiment serves as a region for forming the above-mentioned silicon carbide foundation film 3. That is, by providing the planar face 21, the silicon carbide foundation film 3 can be stably provided adjacent to the groove 22. According to this, when the silicon carbide growth layer 4 is grown by using the silicon carbide foundation film 3 as a seed layer, the silicon carbide growth layer 4 can be efficiently and stably grown toward the groove 22 from the silicon carbide foundation film 3. As a result, the silicon carbide growth layer 4 of higher quality is obtained.

Incidentally, the planar face 21 may be parallel or non-parallel to the lower face 2a (rear face). When it is parallel, the silicon carbide foundation film 3 having a uniform thickness is easily provided to the planar face 21, and therefore, also as the silicon carbide growth layer 4 to be grown toward the groove 22, one with few crystal defects is obtained.

Further, an angle α formed by the planar face 21 and the first crystal face 221 is preferably larger than an angle formed by the planar face 21 and the Si(1-11) plane. The Si(1-11) plane is a plane parallel to a crystal defect, and therefore, by setting the angle formed by the planar face 21 and the first crystal face 221 to an angle larger than the angle formed by the planar face 21 and the Si(1-11) plane, crystal defects are associated with each other with a higher probability, and can be vanished or reduced.

Further, an angle formed by the planar face 21 and the second crystal face 222 is also the same as the angle formed by the planar face 21 and the first crystal face 221.

Further, in FIG. 1, an example in which the planar face 21 is the Si(001) plane is illustrated, however, the planar face 21 is not limited to this plane, and may be a plane formed by inclining the Si(001) plane by a predetermined angle. As one example, a plane formed by inclining the Si(001) plane to the [110] direction by an angle more than 0° and less than 54.7° is exemplified. By using the plane inclined in this manner as the planar face 21, crystal defects can be vanished or reduced not only in the groove 22, but also in the planar face 21. As a result, the silicon carbide growth layer 4 with fewer crystal defects and of high quality can be formed.

Incidentally, the inclination angle from the Si(001) plane is more preferably 1° or more and 15° or less, further more preferably 2° or more and 10° or less. According to this, the above-mentioned effect becomes more prominent, and the quality of the silicon carbide growth layer 4 is further enhanced.

A period C (see FIG. 4) of the groove 22, that is, the sum of a width W2 of the groove 22 and a width W1 of the planar face 21 is not particularly limited, but is preferably 0.1 μm or more and 100 μm or less, more preferably 0.2 μm or more and 20 μm or less. By setting the period C of the groove 22 within the above range, even when the film thickness of the silicon carbide growth layer 4 to be grown on the single crystal substrate 1 is thin, crystal defects can be more efficiently vanished or reduced.

Further, the width W2 of the groove 22 is preferably 5% or more and 95% or less, more preferably 30% or more and 85% or less of the period C of the groove 22. By setting the ratio of the width W2 of the groove 22 to the period C of the groove 22 within the above range, the balance between the width W2 of the groove 22 and the width W1 of the planar face 21 is optimized. As a result, even when the film thickness of the silicon carbide growth layer 4 to be grown on the single crystal substrate 1 is thin, crystal defects can be more efficiently vanished or reduced.

Further, when a single crystal constituting the foundation substrate 2 is a cubic crystal, for example, a (001) plane, a (010) plane, a (001) plane, a (−100) plane, a (0-10) plane, a (00-1) plane, and the like are mutually equivalent planes. Therefore, the Si(001) plane in the description of this application can be replaced with any of these equivalent planes. That is, the Si(001) plane in the description of this application is not limited only to the plane, and therefore, when these equivalent planes are collectively described, these are representatively described as Si{100} plane. Incidentally, in the description of this application, it is described that there is a predetermined relationship between the Si(001) plane and the other planes or directions, however, when the Si(001) plane is replaced with a plane equivalent thereto, the other planes or directions are also replaced so as to maintain the predetermined relationship.

Similarly, for example, a (111) plane, a (−111) plane, a (1-11) plane, a (11-1) plane, a (−1-11) plane, a (−11-1) plane, and the like are mutually equivalent planes. Therefore, the Si(111) plane or the Si(1-11) plane in the description of this application can be replaced with any of these equivalent planes, and therefore, in this application, when these equivalent planes are collectively described, these are representatively described as Si{111} plane. Incidentally, in the description of this application, it is described that there is a predetermined relationship between the Si(111) plane or the Si(1-11) plane and the other planes or directions, however, when the Si(111) plane or the Si(1-11) plane is replaced with a plane equivalent thereto, the other planes or directions are also replaced so as to maintain the predetermined relationship.

Similarly, for example, a [110] direction, a [101] direction, a [011] direction, a [1-10] direction, a [10-1] direction, a [01-1] direction, and the like are mutually equivalent directions. Therefore, the [110] direction or the [1-10] direction in the description of this application can be replaced with any of these equivalent directions, and therefore, in this application, when these equivalent directions are collectively described, these are representatively described as <110> direction. Incidentally, in the description of this application, it is described that there is a predetermined relationship between the [110] direction or the [1-10] direction and the other planes or directions, however, when the [110] direction or the [1-10] direction is replaced with a direction equivalent thereto, the other planes or directions are also replaced so as to maintain the predetermined relationship.

Silicon Carbide Foundation Film

The silicon carbide foundation film 3 is provided on the planar face 21 in the upper face 2b of the foundation substrate 2. This silicon carbide foundation film 3 may be, for example, a carbide film formed by modifying a surface of a silicon single crystal substrate, or may be a silicon carbide film obtained by depositing SiC on the upper face of the foundation substrate 2. Further, the silicon carbide foundation film 3 may be provided only in a portion of the planar face 21.

A crystal structure of the silicon carbide foundation film 3 is not particularly limited, however, for example, a cubic crystal SiC (3C—SiC) is adopted. Incidentally, it may be a crystal other than 3C—SiC, for example, 4H—SiC or 6H—SiC.

Further, the thickness of the silicon carbide foundation film 3 is not particularly limited, but is preferably 1 nm or more and 100 nm or less, more preferably 2 nm or more and 50 nm or less, further more preferably 3 nm or more and 10 nm or less. By setting the thickness of the silicon carbide foundation film 3 within the above range, it has a necessary and sufficient thickness as the seed layer.

Incidentally, when the thickness of the silicon carbide foundation film 3 is less than the above lower limit, the thickness of the silicon carbide foundation film 3 may be insufficient as the seed layer. On the other hand, when the thickness of the silicon carbide foundation film 3 exceeds the above upper limit, the thickness of the silicon carbide foundation film 3 becomes too thick, and therefore, depending on the conditions for epitaxial growth or the like, the silicon carbide foundation film 3 may affect the silicon carbide growth layer 4.

Further, the thickness of the silicon carbide foundation film 3 is determined by a method, for example, by measuring the thickness by a measurement method using an optical technique such as ellipsometry, or by observing a cross section of the single crystal substrate 1 using an electron microscope, a light microscope, or the like, and measuring the thickness of the silicon carbide foundation film 3 on the observation image, or the like.

The whole of the silicon carbide foundation film 3 is preferably a single crystal, but is not necessarily limited thereto, and may be a polycrystal, a microcrystal, or an amorphous crystal.

Incidentally, the silicon carbide foundation film 3 may also be provided in at least a portion of the inside of the groove, that is, the first crystal face 221 and the second crystal face 222 other than on the planar face 21, but is preferably provided only on the planar face 21. According to this, a crystal can be grown toward the inside of the groove 22 by using the silicon carbide foundation film 3 provided at a given density as the seed layer, and therefore, a crystal with fewer crystal defects can be grown. As a result, the silicon carbide growth layer 4 of higher quality can be obtained.

Method for Producing Single Crystal Substrate

Next, an embodiment of a method for producing a single crystal substrate will be described.

FIGS. 5 to 9 are each a view for illustrating an embodiment of the method for producing a single crystal substrate.

A method for producing the single crystal substrate 1 according to this embodiment includes a step of preparing a single crystal base material 100 and a base material with a mask 120 including a first mask 110 provided in a portion of a surface thereof, a step of providing a second mask 30 on the surface of the single crystal base material 100, a step of subjecting the single crystal base material 100 to an etching treatment, thereby forming the groove 22, and a step of removing the first mask 110. According to such a production method, the single crystal substrate 1 can be efficiently produced. Hereinafter, the respective steps will be sequentially described.

Figure 5:
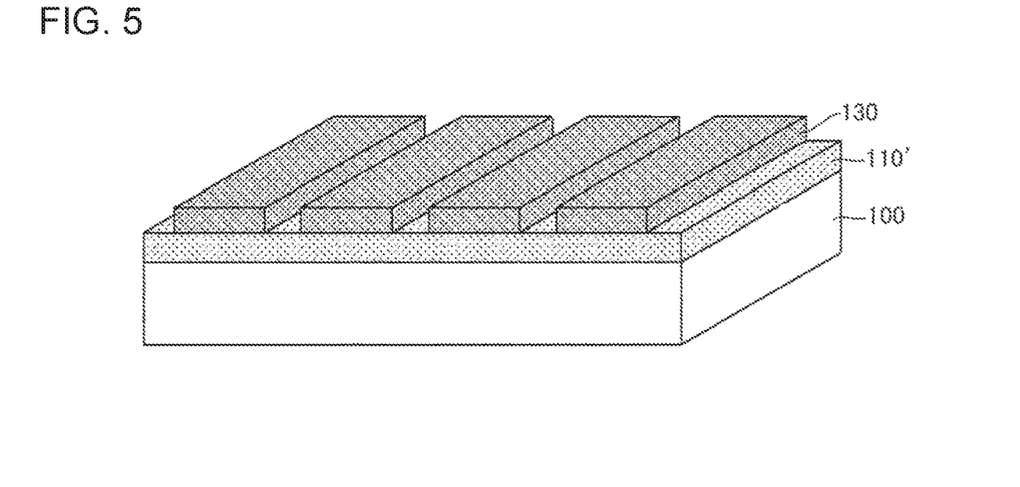
FIG. 5 is a view for illustrating an embodiment of a method for producing a single crystal substrate.

1. First, the single crystal base material 100 is prepared. The single crystal base material 100 becomes a raw material of the foundation substrate 2, and therefore, for example, the same single crystal material as that of the foundation substrate 2 described above is exemplified.

Subsequently, a masking coating film 110' is provided on the surface of the single crystal base material 100. Here, first, the masking coating film 110' is formed so as to cover the entire surface of the single crystal base material 100 (see FIG. 5). The masking coating film 110' is constituted by a material having resistance to the below-mentioned etching treatment of the single crystal base material 100. Examples of such a material include silicon oxide and silicon nitride.

Subsequently, a coating film having photosensitivity is formed on a surface of the masking coating film 110'. Then, this photosensitive coating film is patterned by performing an exposure/development treatment. By doing this, a resist film 130 provided only in a target region is obtained (see FIG. 5).

Subsequently, the masking coating film 110' is subjected to an etching treatment through the patterned resist film 130. By doing this, a region that is not covered with the resist film 130 in the masking coating film 110' is etched. As a result, a first mask 110 provided in a region corresponding to the groove 22 to be formed in the below-mentioned step is obtained (see FIG. 6). Then, a base material with a mask 120 including the single crystal base material 100 and the first mask 110 provided in a portion of the surface thereof is obtained.

Figure 6:
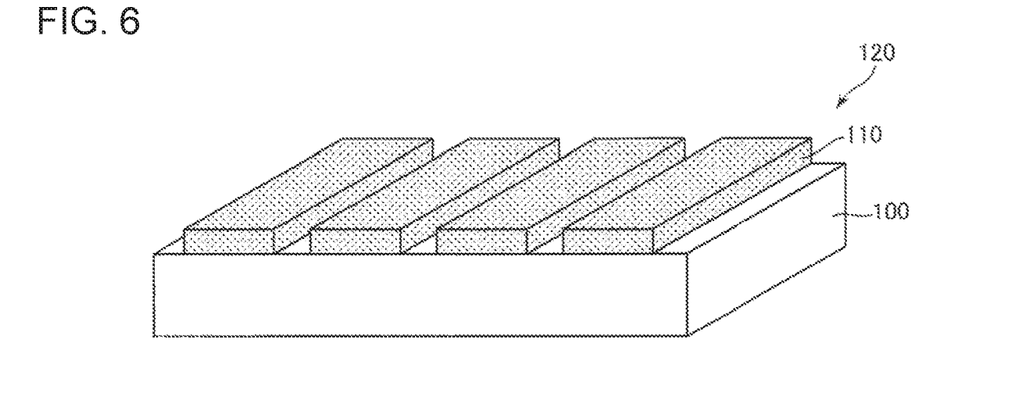
FIG. 6 is a view for illustrating an embodiment of the method for producing a single crystal substrate.

Thereafter, the resist film 130 is removed.

Figure 7:
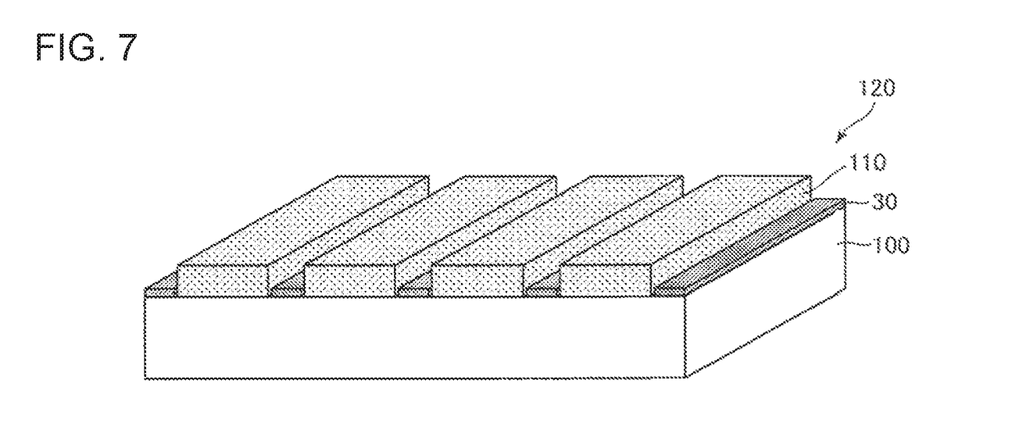
FIG. 7 is a view for illustrating an embodiment of the method for producing a single crystal substrate.

2. Subsequently, as shown in FIG. 7, a second mask 30 is formed on the surface of the single crystal base material 100. This second mask 30 is formed in a region that is not covered with the first mask 110 in the surface of the single crystal base material 100. Incidentally, the second mask 30 may be formed on the surface of the first mask 110, but is omitted in FIG. 7.

A method for forming the second mask 30 is not particularly limited, but examples thereof include a method for forming it by modification (a carbonization treatment) of the surface of the single crystal base material 100, a method for forming it by depositing silicon carbide on the upper face of the single crystal base material 100.

The carbonization treatment is performed by heating the single crystal base material 100 in a carbon-based gas atmosphere. According to the carbonization treatment, a part of the single crystal base material 100 is converted into silicon carbide, and therefore, as compared with other methods, the second mask 30 having high crystallinity can be formed.

The carbon-based gas atmosphere is constituted by a treatment gas containing a carbon-based gas. The carbon-based gas is not limited as long as it is a gas containing carbon, however, examples thereof include hydrocarbon-based gasses such as acetylene ($C_2H_2$), propane ($C_3H_8$), methane ($CH_4$), ethane ($C_2H_6$), n-butane (n-$C_4H_{10}$), isobutane (i-$C_4H_{10}$), and neopentane (neo-$C_5H_{12}$) in addition to ethylene ($C_2H_4$), and among these, one type or two or more types in combination can be used.

Further, it may be a mixed gas of any of these hydrocarbon-based gasses with another gas. Examples of such another gas include a hydrogen silicide-based gas, a silicon chloride-based gas, and a silicon carbide-based gas.

Further, in these treatment gasses, an arbitrary gas such as a carrier gas may be mixed. Examples of the carrier gas include hydrogen, nitrogen, helium, and argon. When the carrier gas is used, the concentration of the carbon-based gas in the treatment gas is appropriately set according to the rate of the carbonization treatment or the like, but is preferably 0.1 vol % or more and 30 vol % or less, more preferably 0.3 vol % or more and 5 vol % or less as an example.

A heating temperature of the single crystal base material 100 in the carbonization treatment is preferably 500° C. or higher and 1400° C. or lower, more preferably 800° C. or higher and 1300° C. or lower, further more preferably 950° C. or higher and 1200° C. or lower. Further, as for a heating time of the single crystal base material 100 in the carbonization treatment, an exposure time to the heating temperature is preferably 0.5 minutes or more, more preferably 1 minute or more and 120 minutes or less, further more preferably 3 minutes or more and 90 minutes or less.

By setting the heating conditions within the above ranges, the second mask 30 having a thickness as described above can be formed. Further, by optimizing a thermal energy to be added, a conversion rate to silicon carbide is optimized, and therefore, the second mask 30 of good quality can be formed.

Further, the carbonization treatment may be performed in any of a normal pressure atmosphere, a pressurized atmosphere, and a reduced pressure atmosphere, but may preferably be performed in a state where the treatment gas is introduced while discharging the gas in a treatment chamber in which the single crystal base material 100 is placed. As one example, an introduction amount of the carbon-based gas in the treatment gas is set to 10 sccm or more and 100 sccm or less.

On the other hand, in a silicon carbide deposition treatment, for example, a gas phase deposition method such as a CVD method or a vapor deposition method is used.

Figure 8:
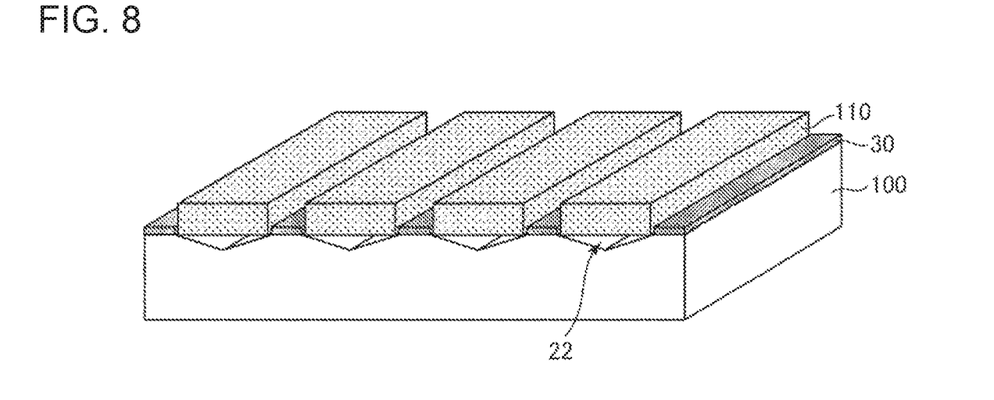
FIG. 8 is a view for illustrating an embodiment of the method for producing a single crystal substrate.

3. Subsequently, the single crystal base material 100 is subjected to an etching treatment. By doing this, the groove 22 is formed.

In this etching treatment, etching is performed so as to remove a region below the first mask 110 (a region facing the first mask 110) in the upper face of the single crystal base material 100.

As such an etching treatment, for example, a treatment in which the base material with a mask 120 provided with the second mask 30 is heated to a temperature not lower than the sublimation temperature of Si is exemplified. By doing this, Si atoms contained in the single crystal base material 100 easily sublime and are discharged to the outside from a gap between the single crystal base material 100 and the first mask 110. As a result, the region below the first mask 110 is etched, and the groove 22 as shown in FIG. 8 is formed.

Incidentally, the heating temperature slightly varies depending on a pressure or the like in a space where the single crystal base material 100 is placed, but is set to a temperature, at which Si atoms can sublime, and which is not higher than the melting point of Si, and may be within a range of 900° C. or higher and 1400° C. or lower. Further, the heating time is set on a timely basis according to the heating temperature, however, the exposure time to the heating temperature is preferably 0.5 minutes or more and 60 minutes or less.

Further, the heating of the base material with a mask 120 may be performed in a normal pressure atmosphere or a pressurized atmosphere, but is preferably performed in a reduced pressure atmosphere or a reducing atmosphere. According to this, sublimation of Si atoms is accelerated or oxidation is prevented, and therefore, the etching treatment can be performed while suppressing denaturation of the single crystal base material 100.

A pressure of this reduced pressure atmosphere is not particularly limited as long as it is less than the atmospheric pressure, but is set to, for example, 0.5 Pa or less.

In such a manner, the groove 22 is formed below the first mask 110.

Incidentally, etching is suppressed in a region where the second mask 30 is formed in the upper face of the single crystal base material 100. Therefore, in this region, the above-mentioned planar face 21 is formed.

Further, in the etching treatment, in place of the above-mentioned heating treatment, a treatment in which the base material with a mask 120 provided with the second mask 30 is exposed to an etching gas may be used.

Figure 9:
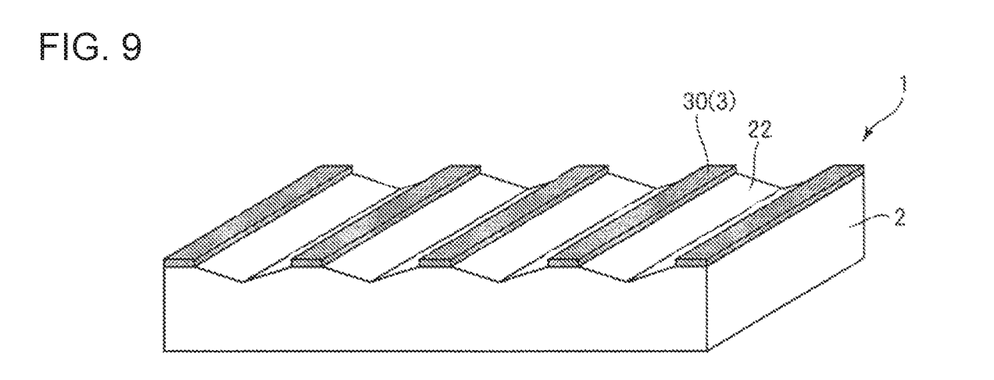
FIG. 9 is a view for illustrating an embodiment of the method for producing a single crystal substrate.

4. Subsequently, the first mask 110 is removed.

In the removal of the first mask 110, for example, an etching treatment is used.

In such a manner, the single crystal substrate 1 shown in FIG. 9 is obtained. Incidentally, the second mask 30 shown in FIG. 9 can be used as the silicon carbide foundation film 3 shown in FIG. 1 described above. Therefore, the second mask 30 may be removed, but may be left without being removed.

Method for Producing Silicon Carbide Substrate

Next, one example of a method for producing the silicon carbide substrate 10 shown in FIG. 1 will be described.

The silicon carbide substrate 10 is produced by epitaxially growing the silicon carbide growth layer 4 on the single crystal substrate 1. The silicon carbide foundation film 3 functions as the seed layer for epitaxially growing the silicon carbide growth layer 4.

The silicon carbide growth layer 4 grows using the silicon carbide foundation film 3 as the seed layer by, for example, housing the single crystal substrate 1 in a treatment chamber, and heating the single crystal substrate 1 while introducing a raw material gas. As a result, the silicon carbide substrate 10 shown in FIG. 1 is obtained.

Examples of the raw material gas include a mixed gas obtained by mixing a gas containing carbon and a gas containing silicon at a predetermined ratio, a carbon and silicon containing gas containing carbon and silicon at a predetermined ratio, and a mixed gas of a plurality of types obtained by mixing a gas containing carbon, a gas containing silicon, and a gas containing carbon and silicon at a predetermined ratio.

Examples of the gas containing carbon among these include acetylene ($C_2H_2$), propane ($C_3H_8$), methane ($CH_4$), ethane ($C_2H_6$), n-butane ($n$-$C_4H_{10}$), isobutane ($i$-$C_4H_{10}$), and neopentane (neo-$C_5H_{12}$) in addition to ethylene ($C_2H_4$), and among these, one type or two or more types in combination can be used.

Further, examples of the gas containing silicon include monosilane ($SiH_4$), disilane ($Si_2H_6$), trisilane ($Si_3H_8$), tetrasilane ($Si_4H_{10}$), dichlorosilane ($SiH_2Cl_2$), tetrachlorosilane ($SiCl_4$), trichlorosilane ($SiHCl_3$), and hexachlorodisilane ($Si_2Cl_6$), and among these, one type or two or more types in combination can be used.

Further, examples of the gas containing carbon and silicon include methylsilane ($SiH_3CH_3$), dimethylsilane ($SiH_2(CH_3)_2$), and trimethylsilane ($SiH(CH_3)_3$), and among these, one type or two or more types in combination can be used.

Further, a heating temperature in the epitaxial growth, that is, a temperature of the single crystal substrate 1 during the epitaxial growth is preferably 600° C. or higher and 1400° C. or lower, more preferably 800° C. or higher and 1350° C. or lower, further more preferably 950° C. or higher and 1100° C. or lower. Further, a heating time in the epitaxial growth is appropriately set according to the intended thickness of the silicon carbide growth layer 4.

Further, a pressure in the treatment chamber in the epitaxial growth is not particularly limited, but is preferably $1 \times 10^{-4}$ Pa or more and the atmospheric pressure (100 kPa) or less, more preferably $1 \times 10^{-3}$ Pa or more and 10 kPa or less.

By epitaxially growing the silicon carbide growth layer 4 on the silicon carbide foundation film 3 in such a manner, the silicon carbide substrate 10 having the silicon carbide growth layer 4 of high quality can be efficiently obtained.

Such a silicon carbide substrate 10 of high quality is favorably used, for example, as a semiconductor substrate capable of producing a high-performance power device.

Hereinabove, the single crystal substrate, the method for producing a single crystal substrate, and the silicon carbide substrate according to the invention are described based on the embodiments illustrated in the drawings, however, the invention is not limited thereto. For example, each of the single crystal substrate and the silicon carbide substrate according to the invention may be one in which an arbitrary component is added to the above-mentioned embodiment. In addition, the method for producing a single crystal substrate according to the invention may be one in which an arbitrary step is added to the above-mentioned embodiment.

EXAMPLES

Next, specific Examples will be described.

1. Production of Silicon Carbide Substrate

Example 1

1. First, as a single crystal base material, a 6-inch (diameter: 150 mm, thickness: 0.625 mm) silicon wafer having a Si(001) plane as a principal plane was prepared. Then, the surface was washed with hydrofluoric acid or the like.

Subsequently, a masking coating film was formed on the entire face of the silicon wafer. Subsequently, a resist film was formed on the masking coating film, and thereafter, the masking coating film was etched. By doing this, a base material with a mask having a first mask patterned into a desired shape was obtained.

2. Subsequently, a second mask was formed on a surface of the base material with a mask. Incidentally, in the formation of the second mask, a treatment of carbonizing the surface of the silicon wafer was performed by heating at 1000° C. for 60 minutes using ethylene gas.

3. Subsequently, the base material with a mask provided with the second mask was subjected to an etching treatment. By doing this, a foundation substrate in which grooves and planar faces extending in a [011] direction are alternately aligned was obtained. In this etching treatment, the base material with a mask was subjected to a heating treatment at 1000° C. for 30 minutes in a reduced pressure atmosphere.

4. Subsequently, the first mask was removed by an etching treatment. By doing this, a single crystal substrate including the foundation substrate and the second mask was obtained.

5. Subsequently, a silicon carbide growth layer was epitaxially grown on the obtained single crystal substrate. By doing this, a silicon carbide substrate was obtained. Incidentally, in the epitaxial growth, the silicon carbide growth layer was obtained by heating at 1000° C. for 2 hours using ethylene gas and dichlorosilane gas as the raw material gas.

Examples 2 to 21

Silicon carbide substrates were obtained in the same manner as in Example 1 except that the production conditions were changed as shown in Table 1 or Table 2.

Comparative Examples 1 to 3

Silicon carbide substrates were obtained in the same manner as in Example 1 except that the production conditions were changed as shown in Table 1.

Comparative Example 4

A silicon carbide substrate was obtained in the same manner as in Example 1 except that the process for forming grooves was omitted.

2. Evaluation of Silicon Carbide Substrate

With respect to the silicon carbide substrates obtained in the respective Examples and the respective Comparative Examples, the density of crystal defects was measured. Note that the density of crystal defects was measured by observing the surface of a central portion of the silicon carbide substrate with an atomic force microscope (AFM).

Subsequently, relative values of the densities of crystal defects in the silicon carbide substrates obtained in the respective Examples and the respective Comparative Examples were calculated when the density of crystal defects in the silicon carbide substrate obtained in Comparative Example 4 was assumed to be 1. Then, the calculated results were evaluated in accordance with the following evaluation criteria.

Evaluation Criteria for Density of Crystal Defects

A: The relative value of the density of crystal defects is less than 0.5.

B: The relative value of the density of crystal defects is 0.5 or more and less than 0.75.

C: The relative value of the density of crystal defects is 0.75 or more and less than 1.

D: The relative value of the density of crystal defects is 1 or more.

The evaluation results are shown in Tables 1 and 2.

TABLE 1

| | | | | Ex. 1 | Ex. 2 | Ex. 3 | Ex. 4 | Ex. 5 | Ex. 6 | Ex. 7 | Ex. 8 | Ex. 9 | Comp. Ex. 1 | Comp. Ex. 2 | Comp. Ex. 3 | Comp. Ex. 4 |
|---|---|---|---|---|---|---|---|---|---|---|---|---|---|---|---|---|
| Production conditions for single crystal substrate | Groove/ planar face | Width of groove | μm | 6 | 8 | 9 | 9 | 9 | 9 | 9 | 10 | 11 | 4 | 4 | 12 | No groove |
| | | Width of planar face | μm | 2 | 2 | 2 | 0.5 | 10 | 25 | 2 | 2 | 2 | 2 | 2 | 2 | |
| | | Inclination angle of planar face | ° | 0 | 0 | 0 | 0 | 0 | 0 | 4 | 0 | 0 | 0 | 0 | 0 | |
| | | Period of groove | μm | 8 | 10 | 11 | 9.5 | 19 | 34 | 11 | 12 | 13 | 6 | 6 | 14 | |
| | | Ratio of groove | % | 75 | 80 | 82 | 95 | 47 | 26 | 82 | 83 | 85 | 67 | 67 | 86 | |
| | | Opening angle of groove | ° | 120 | 150 | 168 | 168 | 168 | 168 | 168 | 172 | 175 | 70.6 | 70.6 | 178 | |
| | Thickness of silicon carbide foundation film | | Nm | 70 | 50 | 50 | 50 | 50 | 50 | 50 | 30 | 50 | 50 | (50) | 50 | 50 |
| Production condition for silicon carbide substrate | Thickness of silicon carbide growth layer | | μm | 0.5 | 0.3 | 0.1 | 0.3 | 0.3 | 0.3 | 0.3 | 0.3 | 0.5 | 0.5 | 0.5 | 0.5 | 0.5 |
| Evaluation result of silicon carbide substrate | Density of crystal defects | | — | B | B | A | B | A | B | A | A | B | C | D | C | D |

* The brackets in Comparative Example 2 indicate that the silicon carbide foundation film was also provided inside the "groove".

TABLE 2

| | | | | Ex. 10 | Ex. 11 | Ex. 12 | Ex. 13 | Ex. 14 | Ex. 15 | Ex. 16 | Ex. 17 | Ex. 18 | Ex. 19 | Ex. 20 | Ex. 21 |
|---|---|---|---|---|---|---|---|---|---|---|---|---|---|---|---|
| Production conditions for single crystal | Groove/ planar face | Width of groove | μm | 9 | 9 | 9 | 9 | 9 | 9 | 9 | 9 | 9 | 9 | 9 | 9 |
| | | Width of planar face | μm | 2 | 2 | 2 | 2 | 2 | 2 | 0 | 0 | 0 | 0 | 0 | 0 |
| | | Inclination angle of planar face | ° | 0 | 0 | 0 | 0 | 0 | 0 | 0 | 0 | 0 | 0 | 0 | 0 |
| | | Period of groove | μm | 11 | 11 | 11 | 11 | 11 | 11 | 9 | 9 | 9 | 9 | 9 | 9 |

TABLE 2-continued

Table 2

|  |  |  | Ex. 10 | Ex. 11 | Ex. 12 | Ex. 13 | Ex. 14 | Ex. 15 | Ex. 16 | Ex. 17 | Ex. 18 | Ex. 19 | Ex. 20 | Ex. 21 |
|---|---|---|---|---|---|---|---|---|---|---|---|---|---|---|
|  | Ratio of groove | % | 82 | 82 | 82 | 82 | 82 | 82 | 100 | 100 | 100 | 100 | 100 | 100 |
|  | Opening angle of groove | ° | 168 | 168 | 168 | 168 | 168 | 168 | 168 | 168 | 168 | 168 | 168 | 168 |
|  | Thickness of silicon carbide growth layer | Nm | 20 | 20 | 20 | 20 | 20 | 20 | 20 | 20 | 20 | 20 | 20 | 20 |
| Production condition for silicon carbide substrate | Thickness of silicon carbide growth layer | μm | 0.1 | 0.3 | 0.5 | 1 | 5 | 10 | 0.1 | 0.3 | 0.5 | 1 | 5 | 10 |
| Evaluation result of silicon carbide substrate | Density of crystal defects | — | B | A | A | A | A | A | C | C | B | A | A | A |

As apparent from Table 1, it was confirmed that the silicon carbide substrates obtained in the respective Examples have a relatively low density of crystal defects. From these results, it was confirmed that a silicon carbide growth layer of high quality can be produced.

In addition, as apparent from Table 2, it was confirmed that in the single crystal substrate provided with the planar face, as compared with a single crystal substrate that is not provided with the planar face, crystal defects are suppressed even when the silicon carbide growth layer to be epitaxially grown is thin.

The invention claimed is:

1. A method for producing a single crystal substrate that is a method for producing a single crystal substrate including a foundation substrate having a plurality of grooves, in which a first crystal face and a second crystal face forming an angle more than 70.6° with respect to the first crystal face extend in a <110> direction, characterized by comprising:

a step of forming a plurality of first masks on a cubic single crystal base material, the plurality of first masks being spaced apart from each other such that a surface of the cubic single crystal base material is exposed between adjacent first masks;

a step of providing a plurality of second masks on the exposed surfaces of the cubic single crystal base material between the adjacent first masks;

a step of etching the cubic single crystal base material by heating the cubic single crystal base material to sublimate a portion of the cubic single crystal base material located beneath the first masks, thereby forming the groove in a region facing the first mask in the surface of the cubic single crystal base material; and a step of removing the first mask.

* * * * *